United States Patent [19]

Dugan

[11] 3,855,692

[45] Dec. 24, 1974

[54] METHOD OF MANUFACTURING CIRCUIT BOARD CONNECTORS

[75] Inventor: William P. Dugan, Ontario, Calif.

[73] Assignee: General Dynamics Corporation (Pomona Division), Pomona, Calif.

[22] Filed: June 28, 1973

[21] Appl. No.: 374,747

[52] U.S. Cl. .......................... 29/625, 29/626, 204/15

[51] Int. Cl. .............................................. H05k 3/00

[58] Field of Search ............. 29/624, 625, 626, 628; 174/68.5; 204/32 R, 32 S, 33, 38 S, 15, 16; 96/36.2, 38.4; 117/50, 130, 213; 317/101 C, 101 CC, 101 CW, 101 D

[56] References Cited

UNITED STATES PATENTS

| | | | |
|---|---|---|---|
| 3,370,351 | 2/1968 | Freehauf et al. | 29/626 UX |
| 3,396,459 | 8/1968 | Freehauf et al. | 29/626 X |
| 3,429,036 | 2/1969 | Freehauf et al. | 29/626 X |
| 3,429,037 | 2/1969 | Dugan et al. | 29/626 X |
| 3,429,038 | 2/1969 | Dugan et al. | 29/626 X |
| 3,431,641 | 3/1969 | Freehauf et al. | 29/626 X |
| 3,457,638 | 7/1969 | Johnson | 204/15 X |
| 3,483,615 | 12/1969 | Gottfried | 29/625 |

*Primary Examiner*—Richard J. Herbst
*Assistant Examiner*—Joseph A. Walkowski

[57] ABSTRACT

Disclosed is a method of manufacturing a "unitube" circuit board, that is, a single or multi-layer circuit board having a plurality of tubes, in continuity with the circuit or circuits, projecting from the board for the connection of electronic component leads.

37 Claims, 14 Drawing Figures

PATENTED DEC 24 1974

3,855,692

METHOD OF MANUFACTURING CIRCUIT BOARD CONNECTORS

BACKGROUND OF THE INVENTION

Unitube circuit boards have been used extensively in 3-D electronic modules. The projecting tube or unitube, which is an integral part of the circuit, provides a convenient, reliable connector between the circuit and the electronic component leads.

A number of manufacturing processes have been developed to produce these unitube circuit boards. U.S. Pat. Nos. 3,370,351, 3,396,459, 3,426,427, 3,429,036, 3,429,037, 3,429,038, 3,431,641, 3,462,832 and 3,508,330 are representative of some of these processes, together with U.S. Ser. No. 329,798 filed Feb. 5, 1973, now U.S. Pat. No. 3,819,430. While these processes have been successively improved, further improvements can be made.

SUMMARY OF THE INVENTION

The present invention is an improved method of manufacturing unitube circuit boards. The method basically involves the building up of the unitube by an electroforming process, that is, forming or growing a part entirely in an electroplating solution, and then forming the unitube circuits by chemical milling. Chemical milling is the process of masking areas desired for the product and then chemically removing the unmasked or exposed areas to form the desired circuit configurations. Basically, the unitubes are produced by the print and etch method using a dry film photo resist.

DESCRIPTION OF THE PREFERRED EMBODIMENTS

Figure 1:
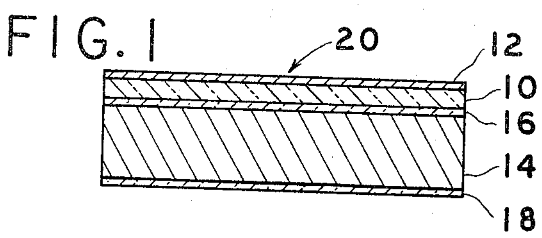
FIGS. 1–12 illustrate the steps of a manner for carrying out the present inventive method.

The sequence of the primary process steps are generally illustrated in FIGS. 1–12. The basic process materials for a single circuit board are: an insulation or positioner board 10 of a material such as "A" stage glass epoxy material clad on one side with a layer of copper 12; a sheet of aluminum 14, such as T6-7075, having a thickness corresponding to the desired height of the tube connectors or unitubes; and two sheets 16 and 18 of a bonding agent material such as "B" stage glass epoxy insulation sheet. The aluminum sheet 14, which is used as a mandrel, is sandwiched between two bonding agent sheets 16 and 18 which are bonded to the positioner board 10 with the copper clad 12 on the side away from the aluminum sheet 14 to form the bonded assembly 20 shown in FIG. 1.

Figure 2:
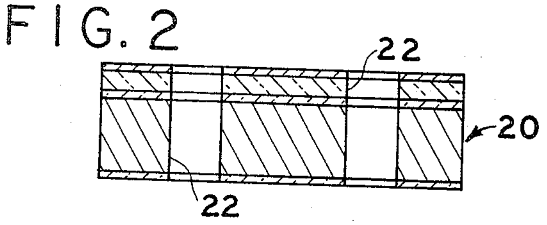

Once the basic process materials have been formed into the bonded assembly 20, a plurality of holes or apertures 22, are formed through the assembly at locations where the unitubes are to be formed. The holes 22, shown in FIG. 2 are formed of an appropriate size to serve as mandrels for the later formation of the unitubes. Holes of an approximate diameter 0.014 inch larger than the desired inside diameter of the unitube have been found to be suitable. Drilling of the holes 22, using an epoxy glass or aluminum back-up sheet and a paper phenolic entry material, is satisfactory. Once drilled, the holes 22 should be cleaned with an abrasive powder.

Figure 3:
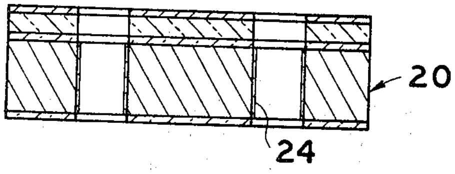

Following the forming of the holes 22, the bonded assembly 20 is copper plated to create electrical continuity between the copper clad 12 and the aluminum sheet or mandrel 14. Since the aluminum is highly reactive to electroless copper plating solutions, the exposed aluminum surfaces in the holes 22 are electrocopper plated to a thickness of approximately 0.0006 inch of copper 24 using a pyrophosphate copper plating process. This will produce the assembly 20 as illustrated in FIG. 3. The exterior edges of the aluminum sheet 14 are sanded prior to the electrocopper plating step to facilitate electrical contact.

Figure 4:
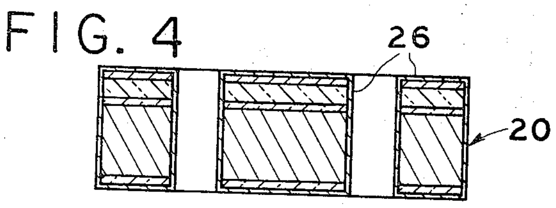

Once the aluminum surfaces have been electrocopper plated, all surfaces of the assembly 20 are electroless copper plated to a thickness of about 0.0001 inch as shown in FIG. 4. Prior to the electroless copper plating step, the exposed surfaces of the epoxy glass board 12 and bonding agent sheets 16 and 18 are sensitized in a suitable catalyst to allow plating on the non-conductive surfaces.

Figure 5:
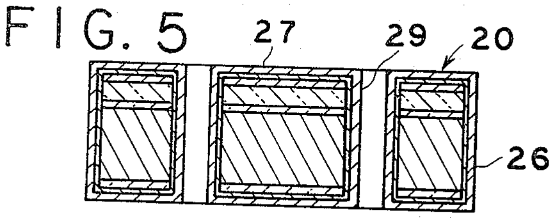

The assembly 20 is then nickel plated 27 to produce the actual unitube 29 as shown in FIG. 5. A sulfamate nickel plating solution can be used to electroform the unitube of approximately 0.004 inch wall thickness ±0.001 inch. With the formation of the nickel unitube 29, the electroforming phase of the circuit board is complete.

Figure 6:
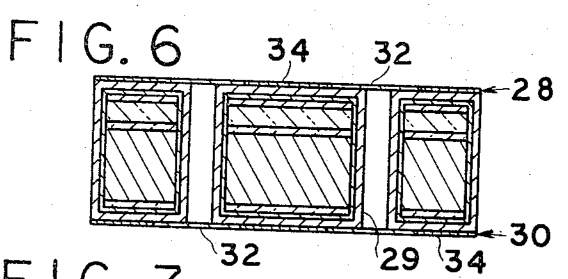

After the nickel plating is cleaned, the top and bottom surfaces of the assembly 20 are coated with a 0.002 inch thick (approx.) dry film photo resist material 28 and 30, respectively. A laminating machine is used to apply the photo resist material which bridges or tents across the holes 22 extending through the assembly 20. Using a negative film as a mask, the desired circuits and the areas bridging the holes 22 are polymerized, making those areas resistant to an etchant solution. The polymerized areas 32, which are resistant to etchant solutions, and non-polymerized areas 34, which are susceptible to etchant solutions, are shown in FIG. 6. This permits the subsequent chemical etching of the desired circuitry without affecting the nickel plating 29 in the holes 22.

Figure 7:
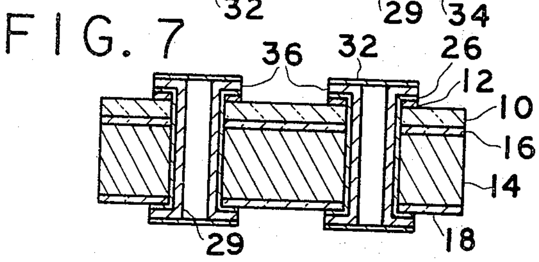
Figure 8:
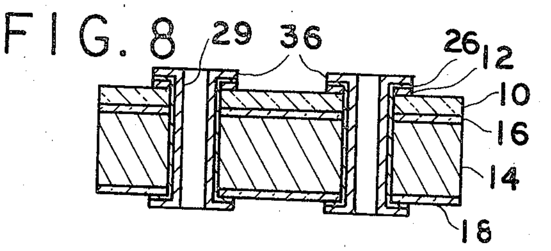

The exposed nickel surfaces 27 are then chemically etched to remove all of the nickel and copper therefrom. This leaves only the nickel circuits 36 and nickel unitubes 29 in the holes 22 as shown in FIG. 7. A chemical etchant solution of ferric chloride is suitable. After the exposed nickel and copper surfaces have been removed, the etchant resistant areas 32 of the photo resist layers 28 and 30 are removed to leave the assembly as shown in FIG. 8. The chemical milling phase of the process is thus complete.

Figure 9:
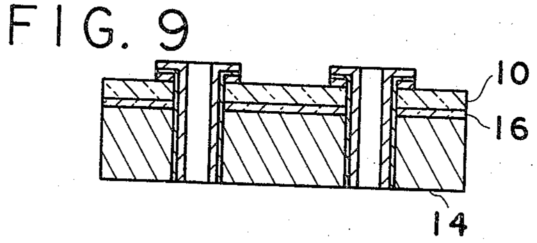
Figure 10:
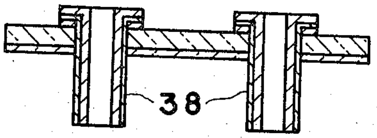
Figure 11:
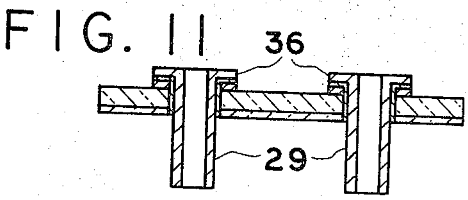

It is still necessary however, to remove the aluminum mandrel 14 from around the nickel unitube 29. The nickel and copper plating which have been formed over the bonding agent sheet 18 and the bonding agent sheet 18 itself are removed by a sanding operation to expose the lower surface of the aluminum sheet 14 as shown in FIG. 9. The aluminum sheet 14 is then dissolved from the unitube circuit board by immersion in a sodium hydroxide solution. A 25 percent by weight sodium hydroxide solution at 180°F is suitable to dissolve the aluminum and produce the board as shown in FIG. 10. The exposed copper flashing 38 around the nickel unitube 29 is removed by a conventional copper stripping operation, such as an ammonium persulfate dip resulting in the unitube printed circuit board of FIG. 11.

Figure 12:
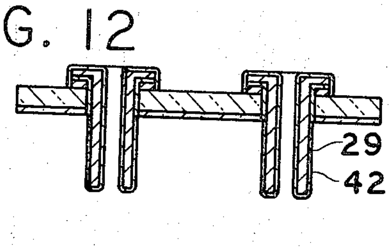

Depending upon the method to be used to attach the electronic component leads into the unitubes, the unitube circuit boards may be prepared for soldering. After completing the unitube circuit board manufacture, the board can be immersed in a solder flux and then in a hot solder bath and finally, if desired, in a hot liquid to reflow the solder to produce the solder coating 42 on the unitube as shown in FIG. 12. It will be understood by those skilled in the art that other coatings can be used.

It should be recognized that only the principal steps of the process have been specifically set forth above and that incidental steps such as cleaning, rinsing, etc., are to be included in the process where required.

The thickness of the positioner board, the number and configuration of the circuit paths, and the number, location, and dimensions of the unitubes are all determined by the specific requirements of the intended application of the circuit board. For example, it is possible to produce a multi-circuit board by bonding a positioner board 50 having an etched copper circuit 52 on one side and a copper clad 54 on the other to an aluminum sheet 56 with two bonding agent sheets 57 and 58 between the copper circuit side of the board and the aluminum sheet and a bonding agent sheet 60 on the opposite side of the aluminum sheet to form the assembly 62 of FIG. 13. Additional boards, having copper circuits on one or both sides can be utilized if more than two circuits are required. Once the initial assembly 62 is bonded, the remaining process steps are identical to the process steps described for the single circuit board.

Figures 13, 14:
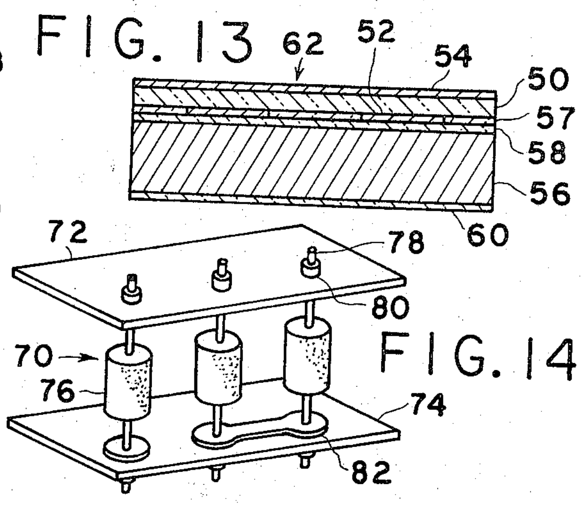
FIG. 13 illustrates the initial step of a manner of carrying out an alternative method of the present invention to produce multi-circuit boards.
FIG. 14 is a view illustrating an application of a circuit board produced by the present inventive method.

The above process produces either a single or multi-circuit board basically comprising nickel unitubes integral with printed circuits secured to a positioner board from which the unitubes project. FIG. 14 illustrates an application of these boards assembled into a 3-D module. The module 70 is formed with an upper circuit board 72 and a lower circuit board 74 disposed around a plurality of components 76. The component leads 78 extend through the circuit board unitubes 80 which are integral with the board circuits 82. The leads 78 and unitubes 80 which extend outwardly from the module 70 can be easily joined by welding across their diameter or soldered if the unitubes have been solder coated.

The circuit boards produced by the above-described method achieve a superior board and connector in a less costly and time-consuming manner which can be more easily controlled. A dry film photo resist is utilized, thus eliminating the liquid neoprene or vinyl maskants previously used. Because the circuits were etched on the boards prior to drilling, the liquid maskant was needed to prevent copper from bridging the etched circuits during an electroless copper plating step. While the liquid maskants used in the prior methods could be made to produce satisfactory unitubes, they involved the spraying or immersion of the entire assembly, oven baking, trimming and subsequently stripping. It has been difficult to drill these assemblies without smearing the holes with maskant, resulting in an extra cleaning operation prior to copper plating. In addition, aluminum chips resulting from the drilling operation would become imbedded in the maskant thus creating plating problems.

With the dry film photo resist process of the present invention, no contaminant enters the holes thus producing a cleaner mandrel for plating. This process can be used to produce both single and multi-circuit boards in a highly reliable and easily duplicatible manner which have excellent storage life and are free from handling contamination. The unitubes can be made of copper only or the copper can be used as the base for many different metals. The unitubes thus formed are very ductile and, when coated with reflow solder, will afford excellent solderability.

By completing the electroforming process, including the plating of the nickel unitubes, before the chemical milling process, it can be seen that the following results are achieved:

1. No masking operation is required.
2. All circuits are electroformed using the same current thus allowing circuits with different part numbers to be plated in the same tank together.
3. Isolated circuit pads are eliminated.
4. Thicker unitubes may be fabricated without closing the openings of the tube.
5. Air gap problems between circuits are eliminated.

Although particular procedures for carrying out the inventive processes have been illustrated and described, it is intended that these are provided by way of example only, the spirit and scope of this invention being limited only by the proper scope of the appended claims.

What I claim is:

1. A method of manufacturing electrical circuit board connectors integral with at least one circuit mounted on a positioner board and projecting therefrom comprising the steps of:

bonding an aluminum sheet disposed between two sheets of a bonding agent to a positioner board having a copper clad on the unbonded side thereof, the aluminum sheet having a thickness of the desired connector height;

forming apertures through the bonded assembly at the locations of the desired projecting, integral connectors, the apertures having a size larger than the inside diameter of the desired connectors;

electro-copper plating the exposed aluminum surfaces in the apertures to a desired thickness;

electroless copper plating all surfaces of the assembly to a desired thickness;

nickel plating all exposed copper surfaces including the copper plated apertures to form nickel connectors therein;

applying a dry film photo resist layer to the top and bottom surfaces of the nickel plated assembly, the photo resist having chemical etchant resistant portions over the apertures and defining an electrical circuit on the nickel clad positioner board and chemical etchant susceptible portions over the remainder thereof;

chemically etching the assembly to remove all of the exposed nickel and copper therefrom;

removing the chemical etchant resistant portions of the photo resist to expose the apertures and the electrical circuit on the positioner board;

removing the bottom bonding agent sheet and any copper or nickel plating thereon to expose the bottom of the aluminum sheet;

dissolving the aluminum sheet to expose the nickel connectors projecting from the positioner board; and removing the exposed copper plating from the outside of the projecting nickel connectors.

2. The method defined in claim 1 wherein the apertures are formed by drilling to a size of about 0.014 inches larger than the desired inside diameter of the projecting, integral connectors.

3. The method defined in claim 1 wherein the connectors are nickel plated to a wall thickness of about 0.004 inches, ±0.001 inches.

4. The method defined in claim 1 wherein a sodium hydroxide solution is used to dissolve the aluminum sheet.

5. The method defined in claim 1 wherein the copper is removed from the outside of the nickel connectors by immersing the assembly in a copper stripping solution.

6. The method defined in claim 1 wherein the positioner board is an A stage glass epoxy.

7. The method defined in claim 1 wherein the bonding agent sheets are a B stage glass epoxy.

8. The method defined in claim 1 and the additional step of forming a solder coating on the nickel connectors.

9. The method defined in claim 1 wherein a copper circuit is disposed on the aluminum sheet side of the positioner board.

10. The method defined in claim 1 wherein the exposed aluminum surfaces are electro-copper plated to a thickness of about 0.006 inches.

11. A method of manufacturing electrical circuit board connectors integral with at least one circuit mounted on a positioner board and projecting therefrom comprising the steps of:

bonding a positioner board having a copper clad on the unbonded side thereof to an aluminum sheet with at least one sheet of a bonding agent, the aluminum sheet having a thickness of the desired connector height;

forming apertures through the bonded assembly at the locations of the desired projecting, integral connectors, the apertures having a size larger than the inside diameter of the desired connectors;

copper plating all surfaces of the assembly including the aperture surfaces to a desired thickness;

nickel plating all exposed copper surfaces including the aperture surfaces to form elongated nickel connectors therein;

applying a dry film photo resist layer to the top and bottom surfaces of the nickel plated assembly, the photo resist having chemical etchant resistant portions over the apertures and defining an electrical circuit on the nickel clad positioner board and chemical etchant susceptible portions over the remainder thereof;

chemically etching the assembly to remove all of the exposed nickel and copper therefrom;

removing the chemical etchant resistant portions of the photo resist to expose the apertures and the electrical circuit on the positioner board;

removing the aluminum sheet and any bonding agent sheets and any copper or nickel plating below the aluminum sheet to expose the nickel connectors projecting from the positioner board; and removing the exposed copper plating from the outside of the projecting nickel connectors.

12. The method defined in claim 11 wherein the apertures are formed by drilling to a size of about 0.014 inches larger than the desired inside diameter of the projecting, integral connectors.

13. The method defined in claim 11 wherein the connectors are nickel plated to a wall thickness of about 0.004 inches, ±0.001 inches.

14. The method defined in claim 11 wherein a sodium hydroxide solution is used to dissolve the aluminum sheet.

15. The method defined in claim 11 wherein the copper is removed from the outside of the nickel connectors by immersing the assembly in a copper stripping solution.

16. The method defined in claim 11 wherein the positioner board is an A stage glass epoxy.

17. The method defined in claim 11 wherein the bonding agent sheets are a B stage glass epoxy.

18. The method defined in claim 11 and the additional step of forming a solder coating on the nickel connectors.

19. The method defined in claim 11 wherein at least one bonding agent sheet is disposed between the positioner board and the aluminum sheet and a bonding agent sheet is disposed on the opposite side of the aluminum sheet.

20. The method defined in claim 11 wherein a copper circuit is disposed on the aluminum sheet side of the positioner board.

21. A method of manufacturing electrical circuit board connectors integral with more than one layer of circuit mounted on a positioner board and projecting therefrom comprising the steps of:

bonding a positioner board having a copper sheet clad on one side thereof and a copper circuit on the other side thereof to an aluminum sheet with two sheets of a bonding agent disposed between the copper circuitry side of the positioner board and the aluminum sheet and a sheet of bonding agent on the opposite side of the aluminum sheet, the aluminum sheet having a thickness of the desired connector height;

forming apertures through the bonded assembly at the locations of the desired projecting, integral connectors, the apertures having a size larger than the inside diameter of the desired connectors;

electro-copper plating the exposed aluminum surfaces in the apertures to a desired thickness;

electroless copper plating all surfaces of the assembly to a desired thickness;

nickel plating all exposed copper including the copper plated apertures to form elongated nickel connectors therein;

applying a dry film photo resist layer to the top and bottom surfaces of the nickel plated assembly, the photo resist having chemical etchant resistant portions over the apertures and defining an electrical circuit on the nickel clad positioner board and chemical etchant susceptible portions over the remainder thereof;

chemically etching the assembly to remove all of the exposed nickel and copper therefrom;

removing the chemical etchant resistant portions of the photo resist to expose the apertures and the electrical circuit on the positioner board;

removing the bottom bonding agent sheet and any copper or nickel plating thereon to expose the bottom of the aluminum sheet;

dissolving the aluminum sheet to expose the nickel connectors projecting from the positioner board; and removing the exposed copper plating from the outside of the projecting nickel connectors.

22. The method defined in claim 21 wherein the apertures are formed by drilling to a size of about 0.014 inches larger than the desired inside diameter of the projecting, integral connectors.

23. The method defined in claim 21 wherein the connectors are nickel plated to a wall thickness of about 0.004 inches, ±0.001 inches.

24. The method defined in claim 21 wherein a sodium hydroxide solution is used to dissolve the aluminum sheet.

25. The method defined in claim 21 wherein the copper is removed from the outside of the nickel connectors by immersing the assembly in a copper stripping solution.

26. The method defined in claim 21 wherein the positioner board is an A stage glass epoxy.

27. The method defined in claim 21 wherein the bonding agent sheets are a B stage glass epoxy.

28. The method defined in claim 21 and the additional step of forming a solder coating on the nickel connectors.

29. The method defined in claim 21 wherein the exposed aluminum surfaces are electro-copper plated to a thickness of about 0.006 inches.

30. A method of manufacturing electrical circuit board connectors integral with at least one circuit mounted on a positioner board and projecting therefrom comprising the steps of:

bonding an aluminum sheet disposed between two sheets of a B stage glass epoxy bonding agent to an A stage glass epoxy positioner board having a copper clad on the unbonded side thereof, the aluminum sheet having a thickness of the desired connector height;

drilling apertures through the bonded assembly at the locations of the desired projecting integral connectors, the drilled apertures having a size larger than the inside diameter of the desired connectors;

electro-copper plating the exposed aluminum surfaces in the drilled apertures to a desired thickness;

sensitizing the exposed glass epoxy surfaces in the drilled apertures;

electroless copper plating all surfaces of the assembly to a desired thickness;

nickel plating all exposed copper including the copper plated apertures to form elongated nickel connectors therein to the desired connector thickness;

applying a dry film photo resist layer to the top and bottom surfaces of the nickel plated assembly;

developing the photoresist material into chemical etchant resistant areas over the apertures and defining an electrical circuit on the nickel clad positioner board and chemical etchant susceptible areas over the remainder thereof;

chemically etching the assembly to remove all of the exposed nickel and copper therefrom;

removing the chemical etchant resistant areas of the photo resist material to expose the apertures and the electrical circuit on the positioner board;

sanding the bottom bonding agent sheet and any copper or nickel plating thereon from the assembly to expose the bottom of the aluminum sheet;

dissolving the aluminum sheet to expose the nickel connectors projecting from the positioner board; and removing the exposed copper plating from the outside of the projecting nickel connectors.

31. The method defined in claim 30 wherein the connectors are nickel plated to a wall thickness of about 0.004 inches, ±0.001 inches.

32. The method defined in claim 30 wherein a sodium hydroxide solution is used to dissolve the aluminum sheet.

33. The method defined in claim 30 wherein the copper is removed from the outside of the nickel connectors by immersing the assembly in a copper stripping solution.

34. The method defined in claim 30 and the additional step of forming a solder coating on the nickel connectors.

35. The method defined in claim 30 wherein the exposed aluminum surfaces are electro-copper plated to a thickness of about 0.0006 inches.

36. The method defined in claim 30 wherein the assembly is electroless copper plated to a thickness of about 0.0001 inches.

37. A method of manufacturing electrical circuit board connectors integral with at least one circuit mounted on a positioner board and projecting therefrom comprising the steps of:

bonding an aluminum sheet disposed between two sheets of B stage glass epoxy bonding agent to an A stage glass epoxy positioner board having a copper clad on the unbonded side thereof, the aluminum sheet having a thickness of the desired connector height;

drilling apertures through the bonded assembly at the locations of the desired projecting integral connectors, the drilled apertures having a size about 0.014 inches larger than the desired inside diameter of the projecting integral connectors;

electro-copper plating the exposed aluminum surfaces in the drilled apertures to a thickness of about 0.0006 inches;

sensitizing the exposed glass epoxy surfaces in the drilled apertures;

electroless copper plating all surfaces of the assembly to a thickness of about 0.0001 inches;

nickel plating all exposed copper including the copper plated apertures to form elongated nickel connectors therein to a connector thickness of about 0.004 inches;

applying a dry film photo resist layer to the top and bottom surfaces of the nickel plated assembly;

developing the photoresist material into chemical etchant resistant areas over the apertures and defining an electrical circuit on the nickel clad positioner board and chemical etchant susceptible areas over the remainder thereof;

chemically etching the assembly to remove all of the exposed nickel and copper therefrom;

removing the chemical etchant resistant areas of the photo resist material to expose the apertures and the electrical circuit on the positioner board;
sanding the bottom bonding agent sheet and any copper or nickel plating thereon from the assembly to expose the bottom of the aluminum sheet;
dissolving the aluminum sheet in a sodium hydroxide solution to expose the nickel connectors projecting from the positioner board;
removing the exposed copper plating from the outside of the projecting nickel connectors by immersing the assembly in a copper stripping solution; and
forming a solder coating on the projecting nickel connectors.

* * * * *